United States Patent
Qian et al.

(10) Patent No.: US 10,607,658 B1
(45) Date of Patent: Mar. 31, 2020

(54) HARD DISK DRIVE TRAY (71) Applicants: INVENTEC (PUDONG) TECHNOLOGY CORPORATION, Shanghai (CN); INVENTEC CORPORATION, Taipei (TW)

(72) Inventors: Ying Qian, Shanghai (CN); Xiaogang Lu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/572,112

(22) Filed: Sep. 16, 2019

(30) Foreign Application Priority Data

Sep. 5, 2019 (CN) .......................... 2019 1 0837697

(51) Int. Cl.
*G11B 33/12* (2006.01)
*G11B 33/02* (2006.01)
*H05K 7/14* (2006.01)

(52) U.S. Cl.
CPC .......... *G11B 33/124* (2013.01); *G11B 33/022* (2013.01); *H05K 7/1489* (2013.01)

(58) Field of Classification Search
CPC ... G11B 33/022; G11B 33/124; H05K 7/1489
See application file for complete search history.

(56) References Cited

U.S. PATENT DOCUMENTS

| | | | | |
|---|---|---|---|---|
| 6,017,230 | A * | 1/2000 | Yao ...................... | G11B 33/122 439/159 |
| 7,679,899 | B2 * | 3/2010 | Hsieh .................... | G06F 1/1616 361/679.38 |
| 8,385,076 | B2 * | 2/2013 | Peng .................... | H05K 7/1401 248/200 |
| 9,406,345 | B2 * | 8/2016 | Yang .................... | G11B 33/128 |
| 9,921,615 | B2 * | 3/2018 | Chen ......................... | G06F 1/18 |
| 10,168,747 | B2 * | 1/2019 | Zhu ......................... | G06F 1/187 |
| 10,212,840 | B2 * | 2/2019 | Kuan .................. | H05K 7/1489 |
| 10,219,401 | B1 * | 2/2019 | Chang ................. | H05K 7/1489 |
| 10,289,172 | B2 * | 5/2019 | Yang ....................... | G06F 1/187 |
| 10,383,249 | B1 * | 8/2019 | Peng ................. | H05K 7/20736 |
| 10,470,330 | B1 * | 11/2019 | Chen .................... | G11B 33/124 |
| 2008/0123280 | A1 * | 5/2008 | Chen ....................... | G06F 1/187 361/679.33 |
| 2019/0069446 | A1 * | 2/2019 | Chang ..................... | H05K 7/18 |

* cited by examiner

*Primary Examiner* — Stanton L Krycinski
(74) *Attorney, Agent, or Firm* — Maschoff Brennan (57) ABSTRACT

The disclosure provides a hard disk drive tray including a tray body, an engagement component, a first elastic component and a switch. The engagement component includes a pivot part, a first arm part, a second arm part and a hook part connected to each other. The pivot part is pivotably disposed on the tray body. The first elastic component is disposed on the engagement component and can force the engagement component to pivot. The switch is movably disposed on the tray body. When the switch is in an engaged position, the switch and the second arm part are engaged with each other, and the hook part is engaged with a casing. When the switch is in a released position, the switch is disengaged from the second arm part, and the first elastic component pivots the engagement component so as to disengage the hook part from the casing.

10 Claims, 6 Drawing Sheets

HARD DISK DRIVE TRAY

CROSS-REFERENCE TO RELATED APPLICATIONS

This non-provisional application claims priority under 35 U.S.C. § 119(a) on Patent Application No(s). 201910837697.0 filed in China on Sep. 5, 2019 the entire contents of which are hereby incorporated by reference.

BACKGROUND OF THE INVENTION

Technical Field of the Invention

The disclosure relates to a hard disk drive tray, more particularly to a hard disk drive tray having an engagement component and a switch which is configured to disengage the engagement component.

Description of the Related Art

As the computer technology progresses, desktop computers, laptop computers or other types of portable computer are widely used in daily life. In addition to the advancement of the communication technology, cross-border e-commerce becomes a major trend. Personal computers are not sufficient to process a massive amount of data generated in the global e-commerce market. As a result, a server (e.g., a rack server, a blade server or tower server) is provided.

Generally, a server cabinet is provided to accommodate one or more servers. Some of the conventional servers have a hard disk drive carrier to accommodate a plurality of hard disk drives. The hard disk drive carrier is fixed on the server casing via screws. Therefore, before starting the maintenance on these hard disk drives, all of the screws have to be removed to allow the staff to take out the hard drive tray, and the screws have to be screwed back after the maintenance.

SUMMARY OF THE INVENTION

One embodiment of the disclosure provides a hard disk drive tray configured to accommodate a hard disk drive and be installed on a casing. The hard disk drive tray includes a tray body, an engagement component, a first elastic component and a switch. The tray body is configured to be slidably mounted on the casing and accommodate the hard disk drive. The engagement component includes a pivot part, a first arm part, a second arm part and a hook part. The pivot part is pivotably disposed on the tray body, the first arm part and the second arm part are respectively connected to two adjacent sides of the pivot part, the hook part is connected to an end of the first arm part away from the pivot part, and the second arm part has a first engagement structure located at an end of the second arm part away from the pivot part. The first elastic component is disposed on the engagement component and configured to force the engagement component to pivot with respect to tray body. The switch is movably disposed on the tray body and has a second engagement structure. The switch is movable between an engaged position and a released position. When the switch is in the engaged position, the second engagement structure and the first engagement structure are engaged with each other, and the hook part is configured to be engaged with the casing. When the switch is in the released position, the second engagement structure is disengaged from the first engagement structure, and the first elastic component pivots the engagement component so as to disengage the hook part from the casing.

BRIEF DESCRIPTION OF THE DRAWINGS

The present disclosure will become more fully understood from the detailed description given hereinbelow and the accompanying drawings which are given by way of illustration only and thus are not limitative to the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, reference lines or buses are omitted in some of the figures.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
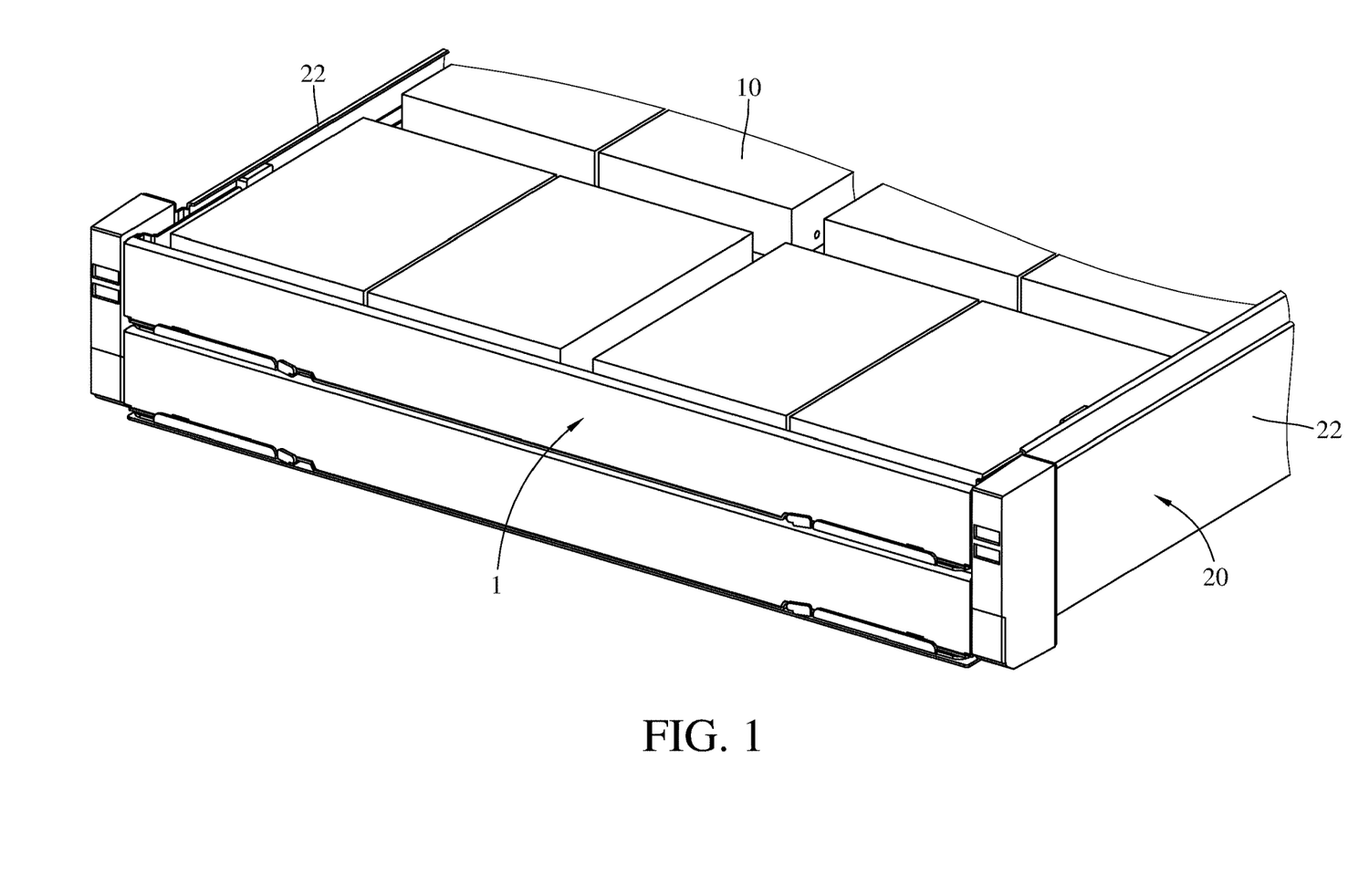
FIG. 1 is a partial perspective view of a hard disk drive tray and a casing according to one embodiment of the disclosure.
Figure 2:
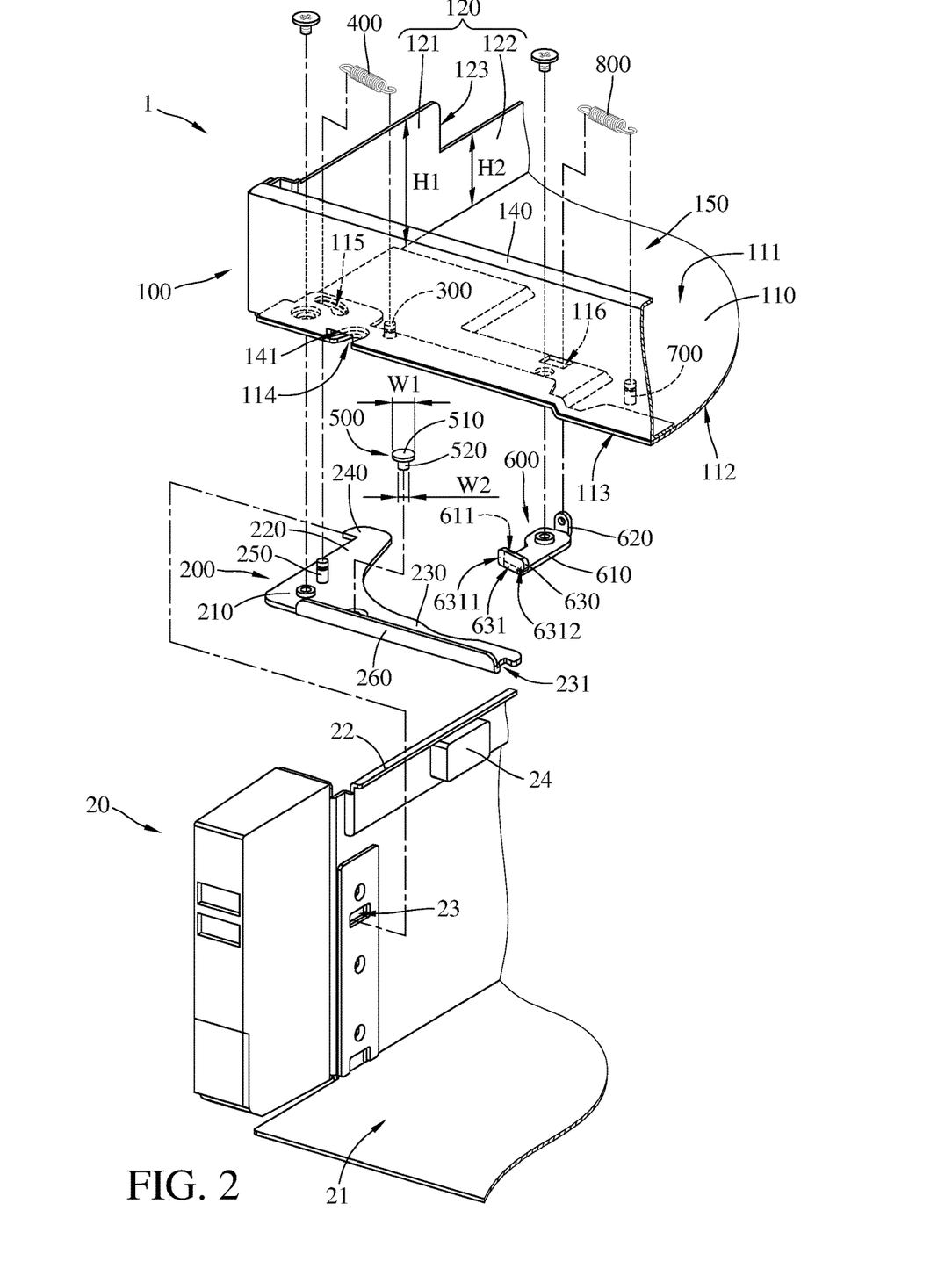
FIG. 2 is a partial exploded view of the hard disk drive tray in FIG. 1.
Figure 3:
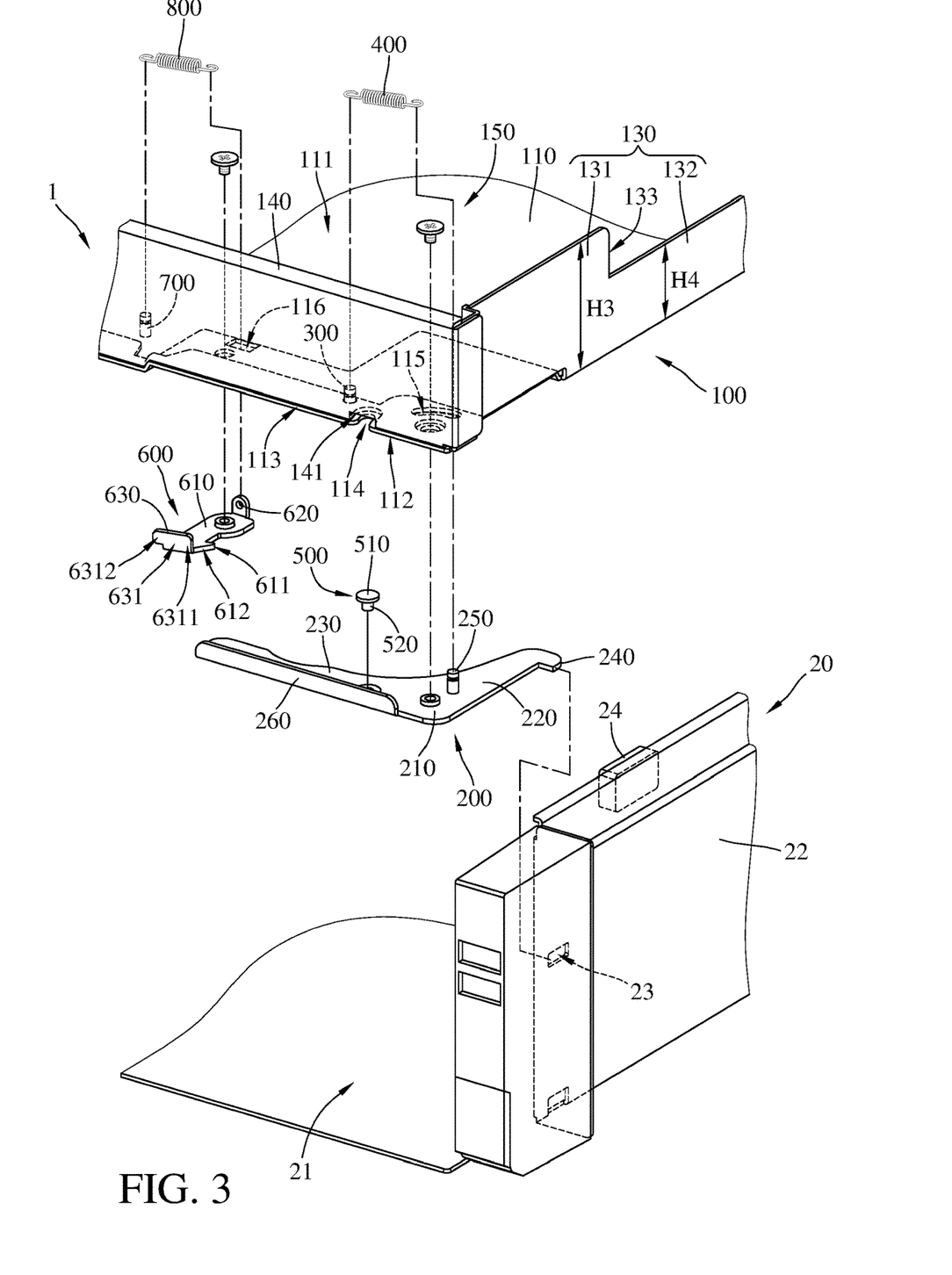
FIG. 3 is another partial exploded view of the hard disk drive tray in FIG. 1.

Referring to FIGS. 1 to 3, FIG. 1 is a partial perspective view of a hard disk drive tray 1 and a casing 20 according to one embodiment of the disclosure, FIG. 2 is a partial exploded view of the hard disk drive tray 1 in FIG. 1, and FIG. 3 is another partial exploded view of the hard disk drive tray 1 in FIG. 1.

In this embodiment, the hard disk drive tray 1 is configured to accommodate at least one hard disk drive 10. The casing 20 is, for example, a server casing. The hard disk drive tray 1 can be installed on the casing 20. The casing 20 has a tray accommodation space 21, two side walls 22, two engagement holes 23 and two positioning blocks 24. The two side walls 22 are located at two opposite sides of the tray accommodation space 21. One of the engagement hole 23 and one of the positioning block 24 are formed on one of the side wall 22.

The hard disk drive tray 1 includes a tray body 100, two engagement components 200, two first pillars 300, two first elastic components 400, two positioning components 500, two switches 600, two second pillars 700 and two second elastic components 800.

The tray body 100 is configured to be slidably mounted in the tray accommodation space 21 of the casing 20. The tray body 100 includes a bottom plate part 110, a first lateral wall part 120, a second lateral wall part 130 and a front plate part 140. The first lateral wall part 120, the second lateral wall part 130 and the front plate part 140 are respectively connected to different sides of the bottom plate part 110. The first lateral wall part 120 and the second lateral wall part 130 are located at two opposite sides of the bottom plate part 110, and the front plate part 140 is located between and connected to the first lateral wall part 120 and the second lateral wall part 130. The bottom plate part 110, the first lateral wall part 120, the second lateral wall part 130 and the front plate part 140 together form an accommodation space 150 therebetween for accommodating the hard disk drives 10.

The first lateral wall part 120 includes a first tall wall 121 and the first short wall 122 connected to each other. A height H1 of the first tall wall 121 is larger than a height H2 of the first short wall 122, such that the first lateral wall part 120 has a first rise 123 between the first tall wall 121 and the first short wall 122. The second lateral wall part 130 includes a second tall wall 131 and a second short wall 132 connected to each other. A height H3 of the second tall wall 131 is larger than a height H4 of the second short wall 132, such that the second lateral wall part 130 has a second rise 133 between the second tall wall 131 and the second short wall 132. The first rise 123 and the second rise 133 are respectively configured to contact the positioning blocks 24 of the casing 20.

The bottom plate part 110 of the tray body 100 has a first surface 111, a second surface 112, a front edge 113, two positioning holes 114, two first positioning grooves 115 and two second positioning grooves 116. The first surface 111 faces the accommodation space 150 and is configured to support the hard disk drives 10. The second surface 112 faces away from the first surface 111; that is, the second surface 112 faces away from the accommodation space 150.

In this embodiment, the hard disk drive tray 1 is symmetric, thus the following paragraphs merely describe the components located at one side of the hard disk drive tray 1.

Figure 4:
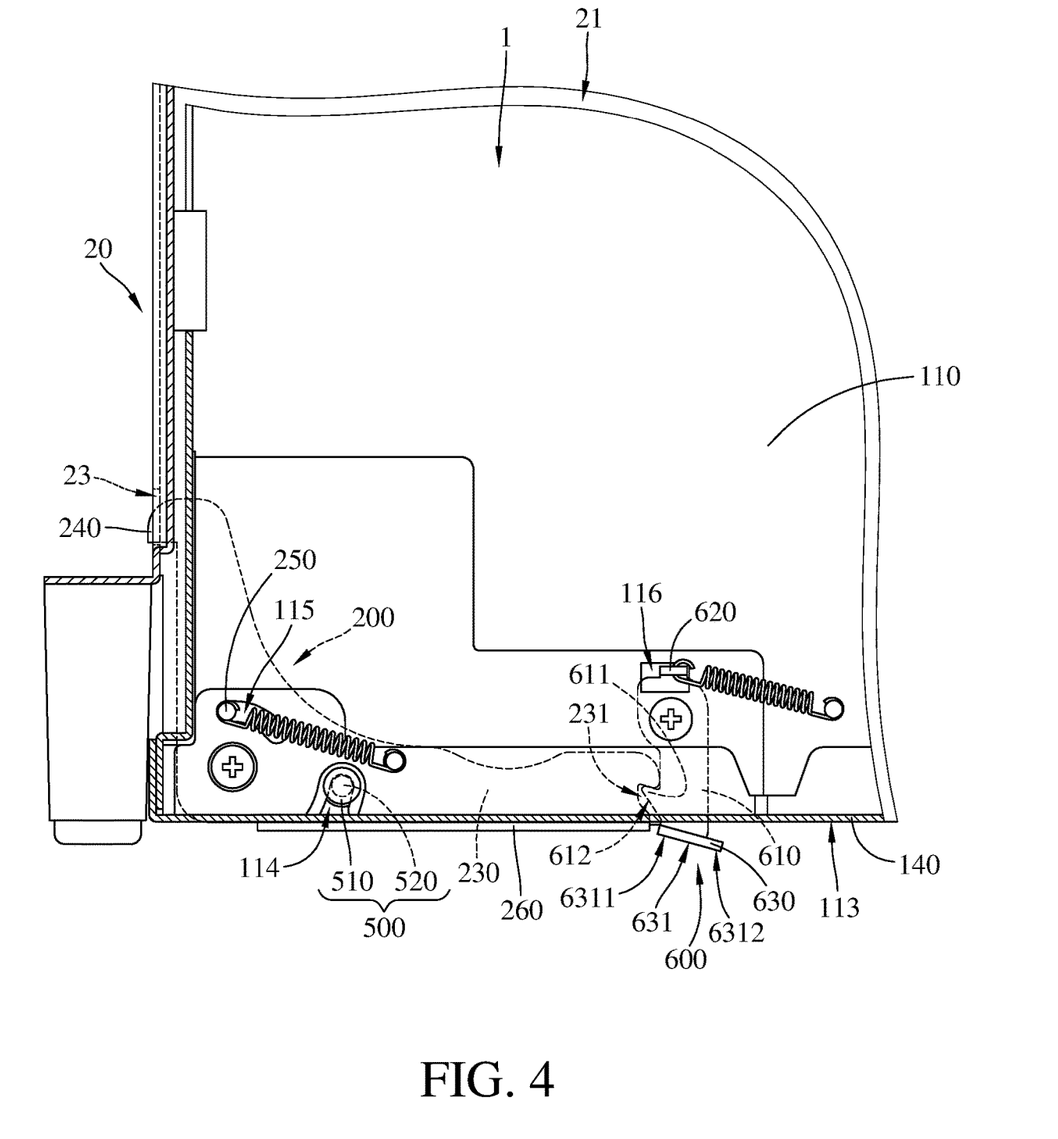
FIG. 4 is a partial cross-sectional top view of the hard disk drive tray in FIG. 1.

Then, referring to FIGS. 2 and 4, and FIG. 4 is a partial cross-sectional top view of the hard disk drive tray 1 in FIG. 1.

In this embodiment, the positioning hole 114 is formed at the front edge 113 and penetrates through the first surface 111 and the second surface 112. In this embodiment, the front plate part 140 is connected to the front edge 113 of the bottom plate part 110 of the tray body 100, and the front plate part 140 has a through hole 141 connected to the positioning hole 114. The first positioning groove 115 and the second positioning groove 116 are spaced apart from the front edge 113. The first positioning groove 115 and the second positioning groove 116 also penetrate through the first surface 111 and the second surface 112. The first positioning groove 115 is located closer to the first lateral wall 120 of the tray body 100 than the second positioning groove 116.

The engagement component 200 includes a pivot part 210, a first arm part 220, a second arm part 230, a hook part 240, a protrusion part 250 and a stopper part 260. The first arm part 220 and the second arm part 230 are respectively connected to two adjacent sides of the pivot part 210, and the hook part 240 is connected to an end of the first arm part 220 away from the pivot part 210 and is configured to be engaged with the engagement hole 23 of the casing 20. The protrusion part 250 protrudes from the first arm part 220. The stopper part 260 is connected to the second arm part 230, and the stopper part 260 and the pivot part 210 are respectively located at two adjacent sides of the second arm part 230. The pivot part 210 of the engagement component 200 is pivotably connected to the second surface 112 of the bottom plate part 110 of the tray body 100 via a bolt or pin. Therefore, the pivot part 210, the first arm part 220 and the second arm part 230 are pivotably located at the second surface 112 of the bottom plate part 110 of the tray body 100. The stopper part 260 is located outside the front edge 113 of the bottom plate part 110. The protrusion part 250 is disposed through the first positioning groove 115 of the bottom plate part 110, and is slidably along the first positioning groove 115. The first pillar 300 protrudes from the first surface 111 of the bottom plate part 110. The first elastic component 400 is, for example, an extension spring. Two opposite ends of the first elastic component 400 are respectively fixed on the protrusion part 250 and the first pillar 300. The first elastic component 400 is configured to force the engagement component 200 to pivot with respect to the tray body 100.

The positioning component 500 includes a head part 510 and a body part 520 connected to each other. A width W1 of the head part 510 is larger than a width W2 of the body part 520. The body part 520 of the positioning component 500 is fixed to the second arm part 230 of the engagement component 200, and the head part 510 of the positioning component 500 is spaced apart from the second arm part 230. A distance between the head part 510 of the positioning component 500 and the second arm part 230 is equal to or larger than a thickness of the bottom plate part 110.

The switch 600 includes a pivotable arm part 610, a protrusion part 620 and a handle part 630. The protrusion part 620 and the handle part 630 are respectively connected to two opposite sides of the pivotable arm part 610. The pivotable arm part 610 is pivotably disposed on the second surface 112 of the bottom plate part 110 of the bottom plate part 110 of the tray body 100. Therefore, the switch 600 is pivotable between an engaged position and a released position. The protrusion part 620 of the switch 600 is disposed through the second positioning groove 116. A part of the pivotable arm part 610 and the handle part 630 of the switch 600 are located outside the front edge 113 of the bottom plate part 110. The handle part 630 has an outer surface 631. The outer surface 631 has a first side 6311 and a second side 6312. The first side 6311 of the outer surface 631 is located closer to the second arm part 230 than the second side 6312. The second pillar 700 protrudes from the first surface 111 of the bottom plate part 110. The second elastic component 800 is, for example, an extension spring. Two opposite ends of the second elastic component 800 are respectively fixed on the protrusion part 620 and the second pillar 700. The second elastic component 800 is configured to force the switch 600 to pivot with respect to the tray body 100.

In this embodiment, the second arm part 230 has a first engagement structure 231 located at an end of the second arm part 230 away from the pivot part 210, and the first engagement structure 231 is, for example, a recess. The pivotable arm part 610 has a second engagement structure 611 and a guide surface 612 located at the second engagement structure 611, and the second engagement structure 611 is, for example, a hook. The second engagement structure 611 is configured to be engaged with the first engagement structure 231.

As shown in FIGS. 2 and 4, when the hard disk drive tray 1 is placed in the tray accommodation space 21 of the casing 20, and the switch 600 is in the engaged position, the protrusion part 250 of the engagement component 200 is located at one end of the first positioning groove 115, the protrusion part 620 of the switch 600 is located at one end of the second positioning groove 116, the first engagement structure 231 of the second arm part 230 of the engagement component 200 and the second engagement structure 611 of the pivotable arm part 610 of the switch 600 are engaged with each other, the body part 520 of the positioning component 500 is located at the positioning hole 114, the bottom plate part 110 is partially located between the head part 230 of the positioning component 500 and the second arm part 230, the stopper part 260 of the engagement component 200 is in contact with the front edge 113 of the bottom plate part 110, and the hook part 240 of the engagement component 200 is engaged with the engagement hole 23 of the casing 20, such that the hard disk drive tray 1 is fixed in position in the tray accommodation space 21 of the casing 20.

In this embodiment, the first engagement structure 231 of the second arm part 230 and the second engagement structure 611 of the pivotable arm part 610 are engaged with each other, such that the switch 600 is fixed in the engaged position, and the hook part 240 of the engagement component 200 is kept being engaged with the engagement hole 23 of the casing 20. As a result, the hard disk drive tray 1 is firmly and securely fixed in the desired position in the tray accommodation space 21 of the casing 20.

In addition, the body part 520 of the positioning component 500 is located in the positioning hole 114, and the bottom plate part 110 of the tray body 100 is partially located between the head part 510 of the positioning component 500 and the second arm part 230, such that the head part 510 of the positioning component 500 is able to limit the movement of the engagement component 200. This prevents the first engagement structure 231 from being detached from the second engagement structure 611 due to unexpected force, such as sudden vibration or impact. Therefore, the hook part 240 is kept being engaged with the engagement hole 23 of the casing 20 and thus further securing the stability of the hard disk drive tray 1 being placed in the tray accommodation space 21 of the casing 20.

In some cases, the door of the conventional server cabinet is only spaced a short distance from the accommodated servers, such as approximately 5 millimeters or shorter. From the view of FIG. 4, when the switch 600 is in the engaged position, there are only the stopper part 260 of the engagement component 200, the handle part 630 and a part of the pivotable arm part 610 of the switch 600 protrude outward the front edge 113 of the bottom plate part 110 of the tray body 100, but their protrusions are very small. Therefore, the hard disk drive tray 1 is allowed to be installed in such server cabinet without having physical interference with the door of the same cabinet. It can be seen that the hard disk drive tray 1 is suitable for a wide variety of server cabinets.

Furthermore, when the switch 600 is in the engaged position, the first side 6311 of the outer surface 631 is located closer to the front edge 113 of the bottom plate part 110 than the second side 6312 of the outer surface 631, such that the outer surface 631 is in an inclined position relative to the front edge 113 of the bottom plate part 110. The inclined handle part 630 of the switch 600 allows the user to easily pivot the switch 600 from the engaged position and the released position.

Figure 5:
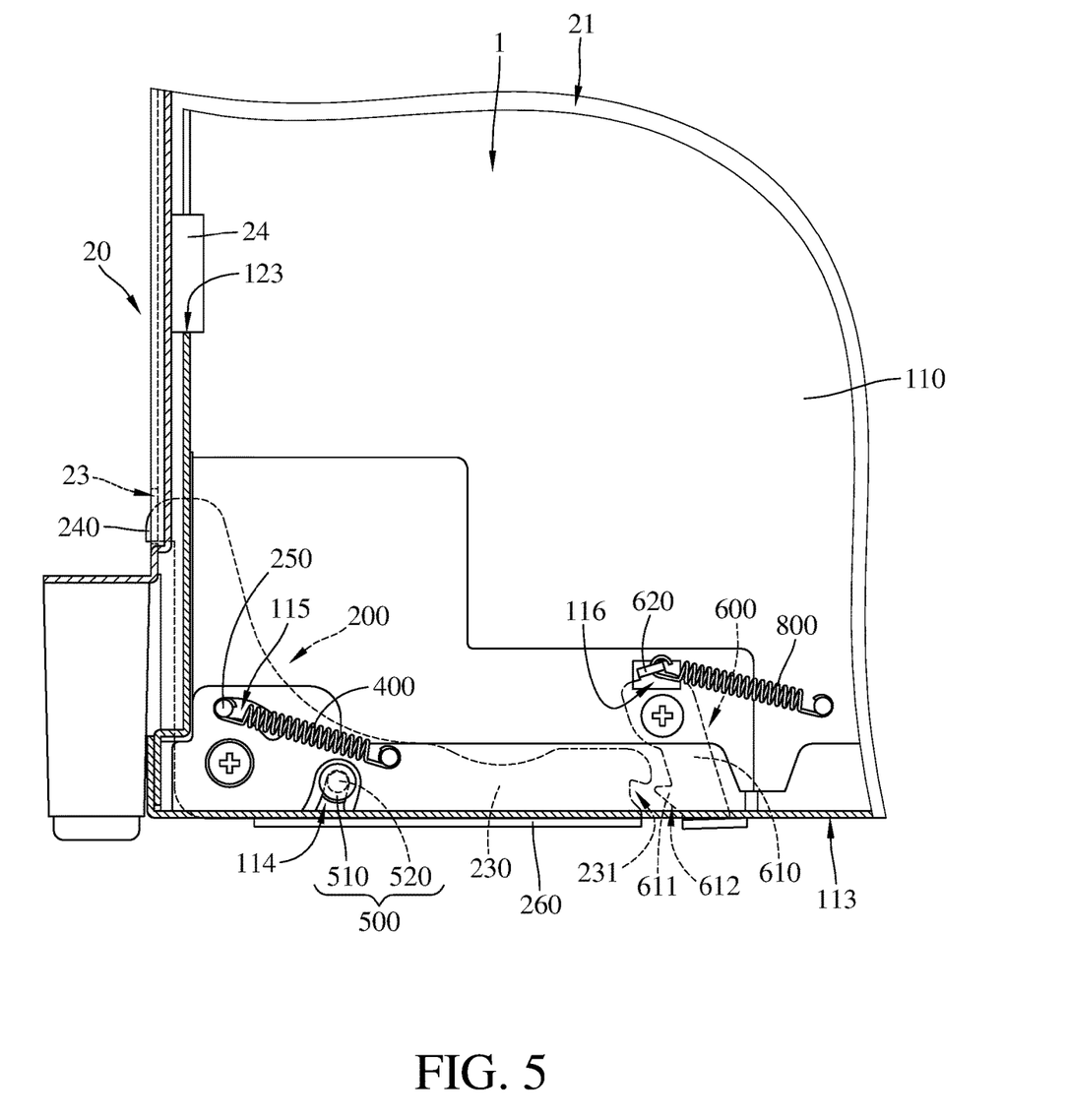
FIG. 5 is a partial cross-sectional top view of the hard disk drive tray in FIG. 4 when a switch is in a released position.
Figure 6:
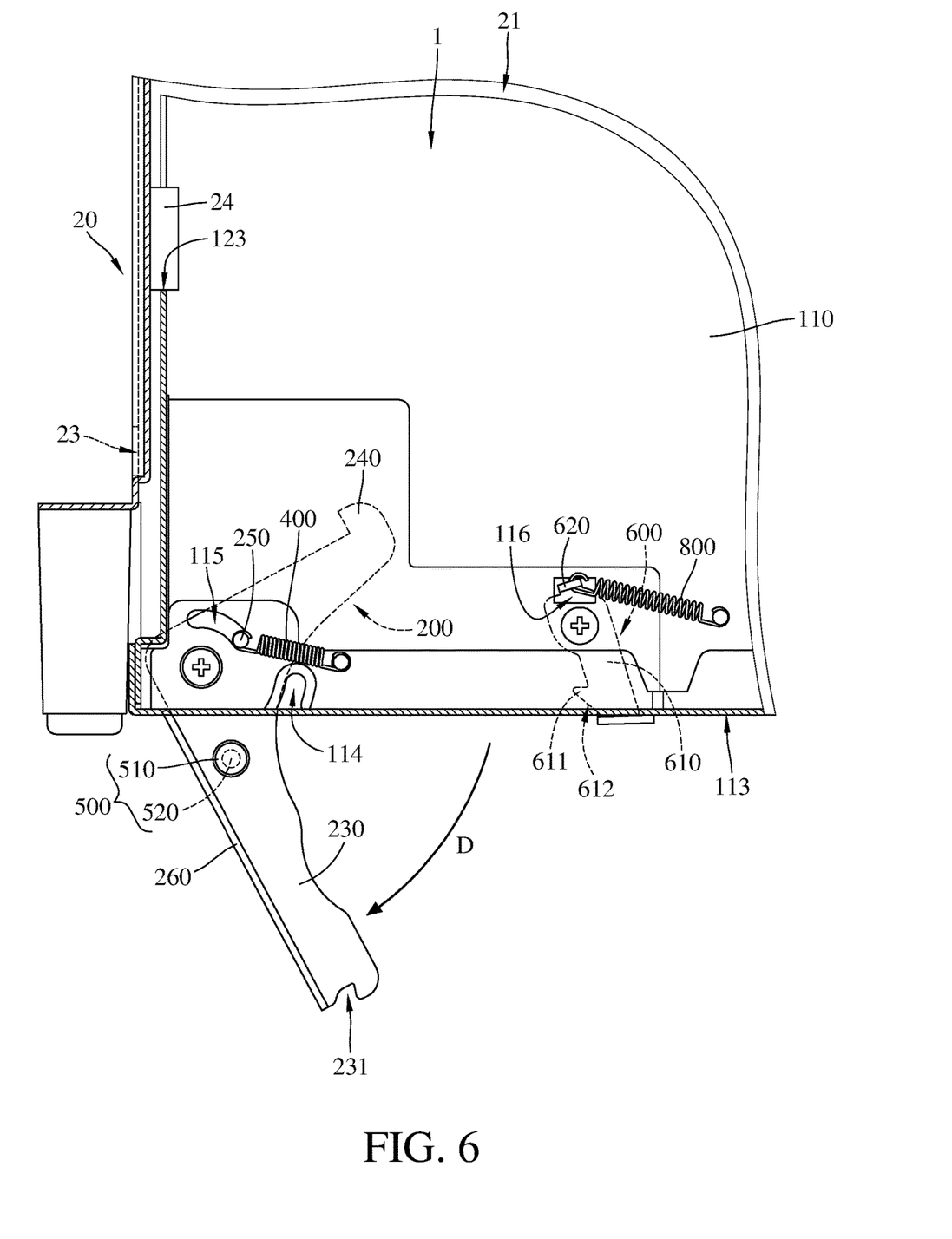
FIG. 6 is a partial cross-sectional top view of the hard disk drive tray in FIG. 5 when an engagement component is disengaged from the casing.

Referring FIGS. 5 and 6, FIG. 5 is a partial cross-sectional top view of the hard disk drive tray 1 in FIG. 4 when the switch 600 is in a released position, and FIG. 6 is a partial cross-sectional top view of the hard disk drive tray 1 in FIG. 5 when the engagement component 200 is disengaged from the casing 20.

While the switch 600 is being switched to the released position, the protrusion part 620 of the switch 600 is moved toward the other end of the second positioning groove 116, and the second engagement structure 611 of the pivotable arm part 610 of the switch 600 is disengaged from the first engagement structure 231 of the second arm part 230 of the engagement component 200, and the elastic force stored in the first elastic component 400 is allowed to force the engagement component 200 to pivot along a direction D, such that the stopper 260 of the engagement component 200 is moved away from the front edge 113, the protrusion part 250 is moved toward the other end of the first positioning groove 115, the head part 510 of the positioning component 500 passes through the through hole 141 (shown in FIG. 2), the body part 520 is removed from the positioning hole 114, and the hook part 240 is disengaged from the engagement hole 23 of the casing 20. As the switch 600 reaches the released position, the hard disk drive tray 1 is allowed to be drawn out from the tray accommodation space 21 of the casing 20 for the user or staff to perform the maintenance process on the hard disk drives 10 on the hard disk drive tray 1.

Then, the user or staff can simply push the hard disk drive tray 1 back in the tray accommodation space 21 of the casing 20. During this movement, the first rise 123 and the second rise 133 of the tray body 100 will respectively contact the two positioning blocks 24 of the casing 20. Then, the user or staff can pivot the engagement component 200 in a direction opposite to the direction D to let the second arm part 230 of the engagement component 200 to push the guide surface 612 of the pivotable arm part 610 of the switch 600 so as to slightly pivots the switch 600. As the second arm part 230 moves across the guide surface 612, the second elastic component 800 forces the second engagement structure 611 to engage with the first engagement structure 231. Meanwhile, the stopper part 260 of the engagement component 200 is moved to contact the front edge 113 of the bottom plate part 110 of the tray body 100, the body part 520 of the positioning component 500 is moved into the positioning hole 114, and the hook part 240 of the engagement component 200 is engaged with the engagement hole 23 of the casing 20. As a result, the hard disk drive tray 1 is fixed in the desired position in the tray accommodation space 21 of the casing 20.

As discussed above, while the hard disk drive tray 1 is being pushed back in the tray accommodation space 21 of the casing 20, the cooperation of the first rise 123 and the second rise 133 and the two positioning blocks 24 of the casing 20 helps the tray body 100 to be positioned in the desired position and thus ensuring the hook part 240 to accurately engage with the engagement hole 23 of the casing 20.

In addition, the stopper part 260 is stopped by the front edge 113 of the bottom plate part 110 of the tray body 100 when the engagement component 200 is pivoted toward the front edge 113 of the bottom plate part 110. Therefore, the stopper part 260 can prevent the engagement component 200 from being overly pivoted. Moreover, the stopper part 260 of the engagement component 200 can increase the overall structural strength of the engagement component 200 and help the user or staff to pivot the engagement component 200.

According to the hard disk drive tray as discussed above, the first elastic component is disposed on the engagement component and configured to pivot the engagement component with respect to the tray body, thus when the switch is pivoted from the engaged position to the released position to disengage the second engagement structure of the switch from the first engagement structure of the engagement component, the engagement component is pivoted by the first elastic component so as to disengage the hook part of the engagement component from the casing. Therefore, the tray body can be released and drawn out from the casing merely by pivoting the switch, such that the hard disk drive is allowed to be removed and installed in an efficient manner and thereby facilitating the maintenance on the hard disk drives.

In addition, when the switch is in the engaged position, there is only the stopper part of the engagement component, the handle part and a part of the pivotable arm part of the switch protrude outward the front edge of the bottom plate part of the tray body, but their protrusions are very small. Therefore, the hard disk drive tray is allowed to be installed in a server cabinet without having physical interference with the door of the same cabinet. It can be seen that the hard disk drive tray is suitable for a wide variety of server cabinets.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A hard disk drive tray, configured to accommodate a hard disk drive and be installed on a casing, comprising:
   a tray body, configured to be slidably mounted on the casing and accommodate the hard disk drive;
   an engagement component, comprising a pivot part, a first arm part, a second arm part and a hook part, wherein the pivot part is pivotably disposed on the tray body, the first arm part and the second arm part are respectively connected to two adjacent sides of the pivot part, the hook part is connected to an end of the first arm part away from the pivot part, and the second arm part has a first engagement structure located at an end of the second arm part away from the pivot part;
   a first elastic component, disposed on the engagement component and configured to force the engagement component to pivot with respect to tray body; and
   a switch, movably disposed on the tray body and having a second engagement structure, wherein the switch is movable between an engaged position and a released position;
   wherein when the switch is in the engaged position, the second engagement structure and the first engagement structure are engaged with each other, and the hook part is configured to be engaged with the casing; when the switch is in the released position, the second engagement structure is disengaged from the first engagement structure, and the first elastic component pivots the engagement component so as to disengage the hook part from the casing.

2. The hard disk drive tray according to claim 1, further comprising a first pillar, wherein the engagement component further comprises a protrusion part, the first pillar protrudes from the tray body, the protrusion part of the engagement component protrudes from the first arm part, two opposite ends of the first elastic component are respectively fixed on the first pillar and the protrusion part of the engagement component.

3. The hard disk drive tray according to claim 2, wherein the tray body has a first surface, a second surface and a first positioning groove, the first surface is configured to support the hard disk drive, the second surface faces away from the first surface, the first positioning groove penetrates through the first surface and the second surface, the first pillar protrudes from the first surface of the tray body, the pivot part, the first arm part, the second arm part and a part of the switch are located at the second surface, and the protrusion part of the engagement component is disposed through the first positioning groove; when the switch is in the engaged position, the protrusion part of the engagement component is located at one end of the first positioning groove; when the switch is in the released position, the protrusion part of the engagement component is located at another end of the first positioning groove.

4. The hard disk drive tray according to claim 3, further comprising a second pillar and a second elastic component, wherein the tray body further has a second positioning groove, the second positioning groove penetrates through the first surface and the second surface, the second pillar protrudes from the first surface, the switch comprises a pivotable arm part and a protrusion part connected to each other, the pivotable arm part is pivotably disposed on the tray body and located at the second surface, the second engagement structure is located at the pivotable arm part, the protrusion part of the switch is disposed through the second positioning groove, two opposite ends of the second elastic component are respectively fixed on the second pillar and the protrusion part of the switch; when the switch is in the engaged position, the protrusion part of the switch is located at one end of the second positioning groove; when the switch is in the released position, the protrusion part of the switch is located at another end of the second positioning groove.

5. The hard disk drive tray according to claim 4, wherein the tray body further has a front edge, the switch further comprises a handle part, the handle part and the protrusion part of the switch are respectively connected to two opposite sides of the pivotable arm part, a part of the pivotable arm part and the handle part are located outside of the front edge, the handle part has an outer surface, the outer surface has a first side and a second side, the first side of the outer surface is located closer to the second arm part of the engagement component than the second side of the outer surface; when the switch is in the engaged position, the first side of the outer surface is located closer to the front edge of the tray body than the second side of the outer surface.

6. The hard disk drive tray according to claim 3, further comprising a positioning component, wherein the tray body further has a front edge and a positioning hole, the positioning hole is formed at the front edge and penetrates through the first surface and the second surface, the positioning component comprises a head part and a body part connected to each, the head part is wider than the body part, the body part is fixed to the second arm part, the head part is spaced apart from the second arm part of the engagement component; when the switch is in the engaged position, the body part of the positioning component is located at the positioning hole, and the tray body is partially located between the head part and the second arm part; when the switch is in the released position, the body part of the positioning component is removed from the positioning hole of the tray body.

7. The hard disk drive tray according to claim 1, wherein the engagement component has a stopper part, the stopper part is connected to the second arm part, the stopper part and the pivot part are respectively located at two adjacent sides of the second arm part, the tray body further has a front edge; when the switch is in the engaged position, the stopper part is in contact with the front edge; when the switch is in the released position, the stopper part is moved away from the front edge.

8. The hard disk drive tray according to claim 1, wherein the first engagement structure is a recess, and the second engagement structure is a hook.

9. The hard disk drive tray according to claim 8, wherein the switch further has a guide surface located at the second engagement structure, and the switch is configured to guide the second arm part via the guide surface of the switch.

10. The hard disk drive tray according to claim 1, wherein the tray body comprises a bottom plate part, a first lateral wall part and a second lateral wall part, the first lateral wall part and the second lateral wall part are connected to two opposite sides of the bottom plate part, the bottom plate part, the first lateral wall part and the second lateral wall part together form an accommodation space therebetween for accommodating the hard disk drive, the pivot part is pivotably disposed on the bottom plate part, and the switch is movably disposed on the bottom plate part, the first lateral wall part comprises a first tall wall and a first short wall which is connected to and shorter than the first tall wall, the second lateral wall part comprises a second tall wall and a second short wall which is connected to and shorter than the second tall wall, the first lateral wall part has a first rise between the first tall wall and the first short wall, the second lateral wall part has a second rise between the second tall wall and the second short wall, the first rise and the second rise are respectively configured to contact two positioning blocks of the casing.

* * * * *